United States Patent [19]
Freisitzer et al.

[11] Patent Number: 5,106,450
[45] Date of Patent: Apr. 21, 1992

[54] DRY FILM RESIST TRANSPORT AND LAMINATION SYSTEM FOR SEMICONDUCTOR WAFERS

[75] Inventors: Norbert Freisitzer, Hyde Park; Rolf G. Meinert, Wappingers Falls, both of N.Y.

[73] Assignee: International Business Machines Corporation, Armonk, N.Y.

[21] Appl. No.: 630,668

[22] Filed: Dec. 20, 1990

[51] Int. Cl.[5] .............................................. B32B 31/00
[52] U.S. Cl. ..................... 156/517; 156/518; 156/519; 156/521; 156/541; 156/542; 156/584
[58] Field of Search ............... 156/540, 541, 542, 235, 156/238, 239, 584, 344, 247, 250, 251, 256, 261, 517, 518, 519, 521, 249, 265

[56] References Cited

U.S. PATENT DOCUMENTS

| | | | |
|---|---|---|---|
| 4,176,602 | 12/1979 | Feddersen | 430/308 |
| 4,413,051 | 11/1983 | Thomas | 430/312 |
| 4,464,221 | 8/1984 | Garber | 156/484 |
| 4,495,014 | 1/1985 | Gebrian et al. | 156/80 |
| 4,585,505 | 4/1986 | Matsuguch | 156/542 X |
| 4,631,103 | 12/1986 | Ametani | 156/344 X |
| 4,664,739 | 5/1987 | Aurichio et al. | 156/344 |
| 4,683,023 | 7/1987 | Sokolovsky | 156/518 |
| 4,732,642 | 3/1988 | Ametani | 156/584 X |
| 4,759,816 | 7/1988 | Kasper et al. | 156/239 X |
| 5,006,190 | 4/1991 | Earle | 156/584 X |

Primary Examiner—David A. Simmons
Assistant Examiner—James J. Engel, Jr.
Attorney, Agent, or Firm—Richard A. Romanchik

[57] ABSTRACT

A dry film photoresist laminator includes a punch and die assembly 24 which punches a rolled sheet dry film photoresist material 14, that is comprised of a dry film photoresist material 18 sandwiched between a Mylar top layer 16 and a polyolefin bottom layer 20, into photresist decals. The photoresist decals are bonded to a tacky transport tape 40 which carries the decals to a polyolefin peeler assembly 54 that rolls a high tack tape 57 along the polyolefin layer 20 of the decal, thereby peeling it from the decal. The decal is advanced to a laminating assembly 71 which rolls the decal onto a heated wafer 72, thereby bonding the exposed photoresist material 18 to the wafer 72. The bonded wafer 72 and decal are advanced to a Mylar peeler assembly 82 which strips the transport tape 40 and the Mylar layer 16 away from the wafer 72, thereby leaving a wafer 72 which laminated with dry film photoresist material 18.

32 Claims, 3 Drawing Sheets

FIG. 5B

DRY FILM RESIST TRANSPORT AND LAMINATION SYSTEM FOR SEMICONDUCTOR WAFERS

TECHNICAL FIELD

This invention relates to semi-conductor manufacturing tools, and more particularly, an apparatus for the application of dry film resist to a semiconductor wafer.

BACKGROUND ART

Photoresist dry films have been developed for use in lithographic processes in the manufacture of integrated circuits. Use of dry film photoresist has become particularly critical in the manufacture of large scale integration (LSI) and very large scale integration (VLSI) devices. Commercially available forms of this film are manufactured by companies such as the Dynachem and Dupont Corporations, and are characterized as being easily contaminated, tacky and limp. Although tacky, these films are "peelable", making it possible to package them with protective cover films such as Mylar TM, polyethylene, or polyolefin to insure the integrity of the photoresist film during handling. Mylar is a trademark of the E.I. Dupont de Nemours Co.. The photoresist manufactured by Dynachem, for instance, is packaged between polyethelene layers and rolled into spools. The photoresist manufactured by Dupont, alternatively, is packaged in multi-layer rolls wherein the photoresist is sandwiched between a Mylar top layer and a polyolefin bottom layer.

For use in lithographic processes, the dry film resist must be uniformly laminated to the substrate under manufacture. This is typically done with a lamination process, but in order to utilize the previously described rolled dry film resists products, the resist material must both be separated from the protective layer(s) and laminated to the substrate. The lamination processes is further complicated by the fact that semiconductor wafers are circular in shape whereas the resist is rolled out as a continuous sheet which is rectangular in shape.

A prior technique utilized to apply photoresist to substrates is described in U.S. Pat. No. 4,495,014 (Gebrian, et al.). Gebrian, et al. discloses a process of laminating under pressure a section of supported photoresist material to a moving sheet substrate, releasing the lamination pressure, removing the support from the laminated layer and thereafter trimming the photoresist layer to conform to the profile of the sheet substrate.

The process disclosed in Gebrian, et al. is unacceptable for semiconductor wafers because the trimming process is restricted to trimming the photoresist material to the outside profile of rectangular substrates. In semiconductor wafer processing, a non-exclusion area (typically 3 millimeters) within the outside diameter of the wafer is required for handling of the wafer. This means that the resist material must be trimmed in a circular pattern within the outside diameter of the wafer.

The prior technique for placing dry film resist on circular wafers was to laminate the resist to the wafer, and then trim the resist into a circular pattern inside the outer diameter of the wafer. The trimming process included either trimming with a laser or a sharp edge, such as a knife. Laser cutting is unacceptable because the heat produced from the process tends to bond the plastic protective layer to the wafer. Likewise, knife cutting processes are unacceptable because they cause a great deal of structural damage to the wafer and the resultant patterns are not dimensionally accurate.

An apparatus which automatically and accurately laminates circular dry film resist patterns to semiconductor wafers, is therefore highly desirable.

DISCLOSURE OF THE INVENTION

The object of the present invention is to provide for an apparatus which automatically laminates trimmed dry film resist material onto semiconductor wafers with a high degree of uniformity and accuracy.

According to the present invention, rolled dry film resist material which is sandwiched between two protective layers is unrolled and punched into circular patterns that are deposited onto a transport tape. The protective covering is then removed from the side of the resist pattern not attached to the transport tape by a peeling roller assembly. The resist pattern is then laminated onto a semiconductor substrate.

The present invention allows for the lamination of semiconductor substrates in a single manufacturing step. The dry film resist is applied bubble-free in a highly uniform manner. In addition the resist material is cut and placed on the wafers with a high degree of accuracy and free of voids. The apparatus is easily adaptable to dry film resists which are manufactured with either one or two protective layers. The present invention is therefore a highly productive, manufacturing tool which provides high quality dry film laminates.

These and other objects, features and advantages of the present invention will become more apparent in light of the detailed description of the exemplary embodiments thereof as illustrated by the drawings.

BEST MODE FOR CARRYING OUT THE INVENTION

Figure 1:
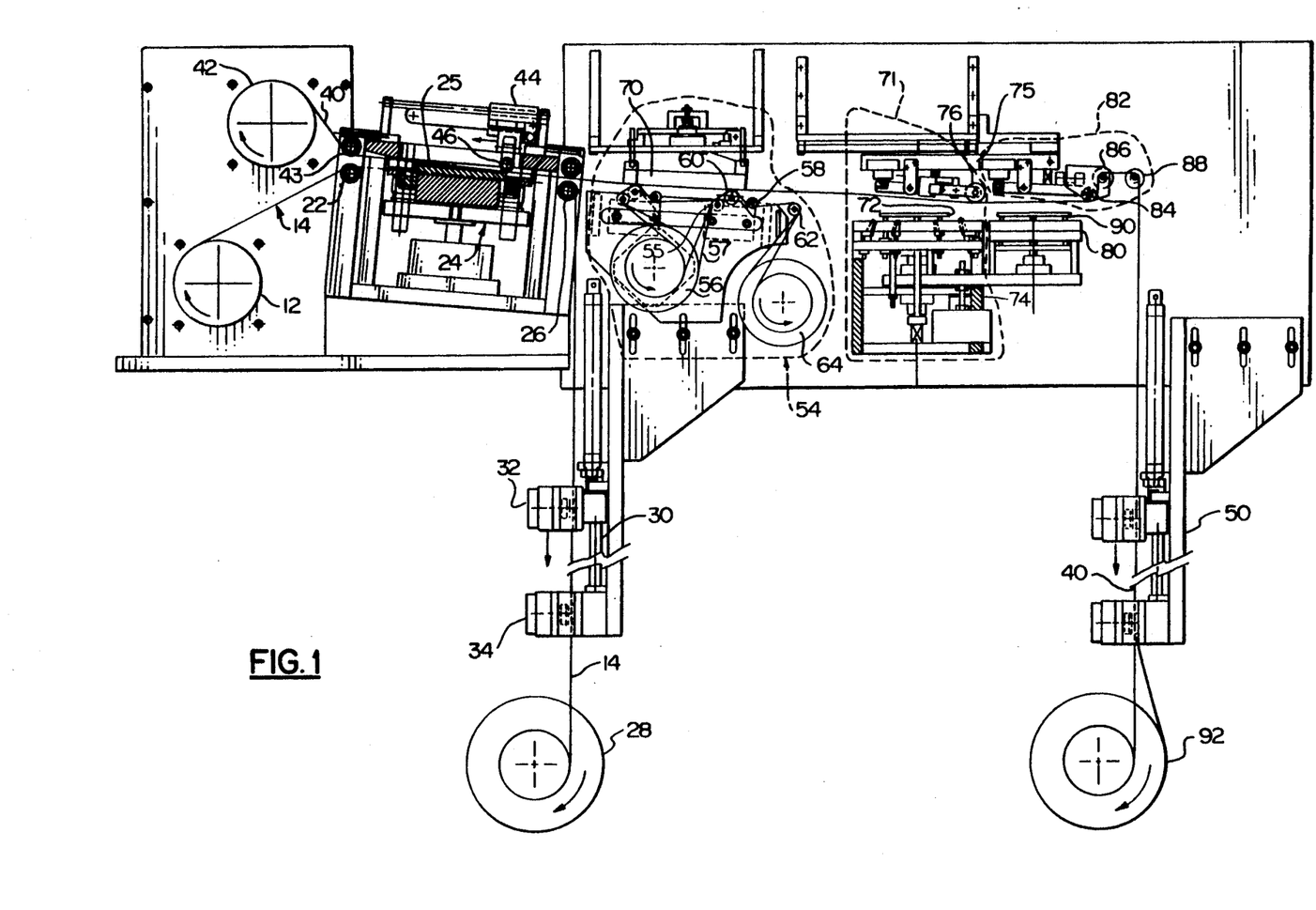
FIG. 1 is a side view of the lamination apparatus of the present invention.

Referring now to FIG. 1, the dry film resist of dry film resist material 14. The preferred dry film resist material in the present embodiment is Riston TM. Riston is a trademark of E.I. DuPont deNemours Co. and is comprised of a photosensitive dry film resist disposed between a top protective layer of Mylar and a bottom carrier layer of polyolefin. Although Riston is used in the preferred embodiment, any dry film resist material which is adhered onto a protective layer and rolled into spools can be utilized.

Figure 2:
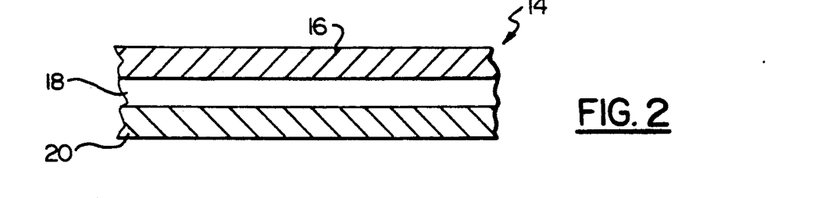
FIG. 2 is a cross-sectional view of the dry film resist material of the present invention.

Referring now to FIG. 2, the Riston tape 14 is comprised of a top protective layer of Mylar plastic film 16, a layer of dry film resist material 18 and a bottom layer of polyolefin 20.

Referring now to FIG. 1, the Riston 14 from spool 12 is guided around a roller 22, over a punch press assembly 24, around another roller 26 and is collected by a take up spool 28.

The Riston 14 is advanced in accurate 6 inch steps by a hitch feed advance mechanism 30. These mechanisms are well known in the prior art and are comprised of a moving gripper 32 which grips the tape 14 and advances it forward exactly 6 inches. A stationary gripper 34 then grips the tape until the moving gripper releases the Riston, returns back to its original position, and grips the tape 14 again. The present invention carries out a sequence of manufacturing steps with the tape 14 being advanced after each step in the sequence. A torque motor (not shown) applies torque to the take up spool 28 in order to keep tension on the tape 14 in the forward direction of travel while another torque motor (not shown) applies torque to the supply spool 12 to keep tension upon the tape 14 in the opposite direction of travel.

After the resist tape 14 is advanced by the advance mechanism 30, a punch assembly 24 is moved vertically upward forcing the dry film resist laminate 14 through a circular die 25, thereby punching out a circular "decal" of tape. It is required that the Riston be clamped to the punch during the punching process. The preferred method of clamping the Riston is by making the top inner surface of the punch assembly 24 be configured as a vacuum chuck in order to hold the resist material flat against this surface. Vacuum chucks are well known in the prior art and are typically utilized in the semiconductor art for clamping silicon wafers.

A transport tape laminator assembly 44 is then lowered vertically to cause a gimbaled laminating roller 46 to create contact between a transport tape 40 and the leading edge of the resist decal. The transport tape 40 is provided by a spool 42 and is utilized to carry resist decals through the laminator of the present invention. The transport tape 40 must be a sticky, low stress and low tack tape, such as part number 336 manufactured by 3M. The transport tape 40 comes off of spool 42, around roller 43, and passes through the punch assembly 24 above the die 25, punch 24 and resist decal. A slight angular separation of about 10 degrees is maintained between the roller 46 contact point and the rest of the resist decal in order to prevent premature contact of the transport tape to the resist decal.

The laminating roller 46 is then rolled toward the trailing edge of the decal, thereby uniformly laminating the resist decal to the transport tape 40. A downward pressure of about 1 pound and a lamination roller speed of about 50 mm per second is adequate to provide a bubble free, uniform bond to the transport tape 40.

Vacuum on the punch assembly 24 top inner surface is then released and a slight positive pressure is provided to separate the resist decal from the punch. After separation, the resist decal is now suspended by its Mylar layer 16 to the transport tape 40. The punch assembly 24 is then lowered to allow clearance for movement of the transport tape 40 and a transport tape advancement mechanism 50, identical to the dry film resist tape advance mechanism 30, advances the transport tape exactly 6 inches to the next station. Operation of the transport tape advance mechanism 50 is identical to the dry film resist tape mechanism 30 and both tapes advance in unison. With each advance of the tapes, 14, 40, a new resist decal is punched out.

After the resist decal is bonded to the transport tape 40, the tape is advanced and the decal is positioned in a polyolefin peeler assembly 54, which removes the now exposed bottom polyolefin layer 20. A 1" wide high tack tape 57, such as part number 800 manufactured by 3M is reeled off of a supply spool 56 and is guided around a guide roller 55, a pressure roller 60, a separating roller 58 and a guide roller 62 and is collected on a take up spool 64. Take up spool 64 is driven by a gear motor which is not shown, to advance the tape 57. A torque is applied to the supply spool 56 in the opposite direction of the take up spool 64 by a torque motor similar to the torque motor driving spools 12 and 42, all of which are not shown.

A pressure plate and chuck assembly 70 is moved downward to cause the pressure roller 60 to create contact between the peeling tape 57 and the polyolefin layer 20 at the leading edge of the resist decal. The separating roller 58 and the pressure roller 60 and guide roller 55 are then moved linearly along the bottom of the resist decal towards the trailing edge of the decal, thereby causing the peeling tape 57 to bond to the bottom polyolefin layer 20, and strip the layer away from the resist decal. The polyolefin layer 20 of the resist decal is subsequently moved along the peeler track and wound onto the peeler take up spool 64. A force applied by the pressure roller 60 of about 50 grams, is adequate to remove the polyolefin layer 20 from the resist decal. The pressure plate and chuck assembly 70 is utilized to support the transport tape 40 while the peeling assembly 54 peels the polyolefin layer 20. The pressure plate and chuck assembly 70 is positioned above the transport tape 40 and moved vertically downward to come in contact with the tape during the peeling process.

After the polyolefin is peeled off the resist decal, the transport tape advance mechanism 50 advances the transport tape 40 (and the polyolefin-less resist decal) to a laminating assembly 71. A semiconductor wafer 72 is placed on a heated vacuum chuck assembly 74 and raised vertically upward to a lamination level. A gimbaled lamination roller 76 positioned above the transport tape 40 is lowered, forcing the resist decal into contact with the leading edge of the wafer 72. A slight angular separation of about 10 degrees between the wafer 72 and the resist decal prevents premature contact between the decal and the wafer behind the roller 76. The lamination roller 76 is attached to a gurney 75 which moves the roller linearly back toward the trailing edge of the wafer 72. Pressure from the roller 76 thereby laminates the resist decal onto the wafer 72 surface. A lamination roller force of about 1 pound and a rolling speed of about 50 mm per second is adequate to bond the resist decal to the wafer uniformly and free of bubbles. Also, heating the wafer to about 85 degrees Celsius by utilizing a heated vacuum chuck promotes better bonding of the resist decal to the wafer.

After the resist decal is laminated to the wafer 72, the pressure from the vacuum chuck 74 is released and the chuck is lowered, leaving the wafer 72 suspended by the transport tape 40. The transport tape advance mechanism 50 then advances the wafer 72 to a Mylar peeler assembly 82.

The Mylar peeler assembly 82 includes a Mylar peeler/separating roller 86 and a Mylar peeler pressure roller 84, arranged so as to create an approximately 90 degree bend in the transport tape as it is threaded under the separating roller 86 and over the pressure roller 84.

The rollers 84, 86 are gimballed and attached to a gurney 75.

The Mylar peeler assembly 82 also includes a vacuum chuck assembly 80 which moves vertically upward to clamp the wafer 72. The gurney is then moved linearly back towards the trailing edge of the wafer 72. The Mylar separating roller 86 and Mylar pressure roller 84 apply a vertical peeling force to the transport tape 40 as the gurney 75 is moved and the Mylar protective layer 16 is peeled off the wafer 72. Process flexibility is provided up to this point to either remove the Mylar layer 16 from the resist decal, or to separate the transport tape 40 from the Mylar layer 16, leaving the Mylar layer 16 bonded to the resist covered wafer 90. This flexibility is achieved by selection of the adhesive characteristics of the transport tape 40 and the temperature of the vacuum chuck 80. If the Mylar layer 16 is removed from the wafer 90, it remains bonded to the transport tape 40 and is collected by the transport tape collection spool 92. The Mylar layer 16 may be removed by using a high tack transport tape 40, such as part number 800 by 3M, and keeping the temperature of the vacuum chuck assembly 80 (and thus the wafer 72) at ambient temperature. If the Mylar layer 16 is not to be removed, a lower tack transport tape 40, such as part number 336 by 3M, should be utilized and the temperature of the vacuum chuck 80 should be raised to about 45 degrees Celsius.

After removal of the Mylar layer 16, the wafer 90 is lowered by the vacuum chuck assembly 80 and unloaded from the tool. It can be seen that a single stroke of the gurney 75 will both laminate a first wafer and peel the Mylar layer 16 from a second wafer.

The sequences described above are repeated as new wafers are loaded, laminated and unloaded. The transport tape advance mechanism 50 provides for highly accurate positioning of the resist decals in the direction of the movement of the transport tape. The side to side motion of the transport tape is controlled by the Mylar separating roller 86 and a guide roller 88, which is positioned between the separating roller 86 and the transport take up spool 92. Both of these rollers 86, 88 are flanged and machined to have a self regulating surface to prevent side to side tracking of the transport tape 40. This can be done in a number of ways well known in the prior art, such as crowning or spiralling. In the present embodiment, these rollers 86, 88 have been machined with a Chevron wrap, as will be illustrated hereinafter in more detail in FIG. 3.

It is to be noted that the rolling surfaces of all of the aforementioned rollers are composed of a soft pliable material, such as silicon rubber, to insure conformability of the surfaces being rolled.

Figure 3:
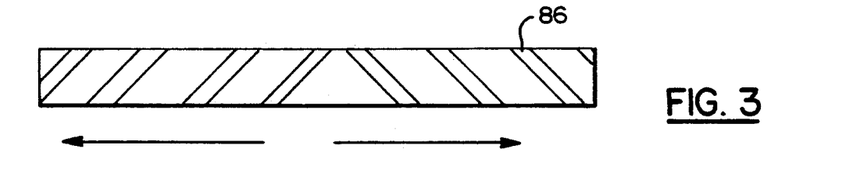
FIG. 3 is a side view of the Mylar peel, pressure roller of the present invention.

Referring now to FIG. 3, the Mylar peel separating roller 86 has a Chevron type wrap machined into the silicon rubber rolling surface. This type of wrap applies an outward force on the transport tape 40 from the center of the roller to the outer edges, thereby insuring no side to side movement of the transport tape.

Figure 4:
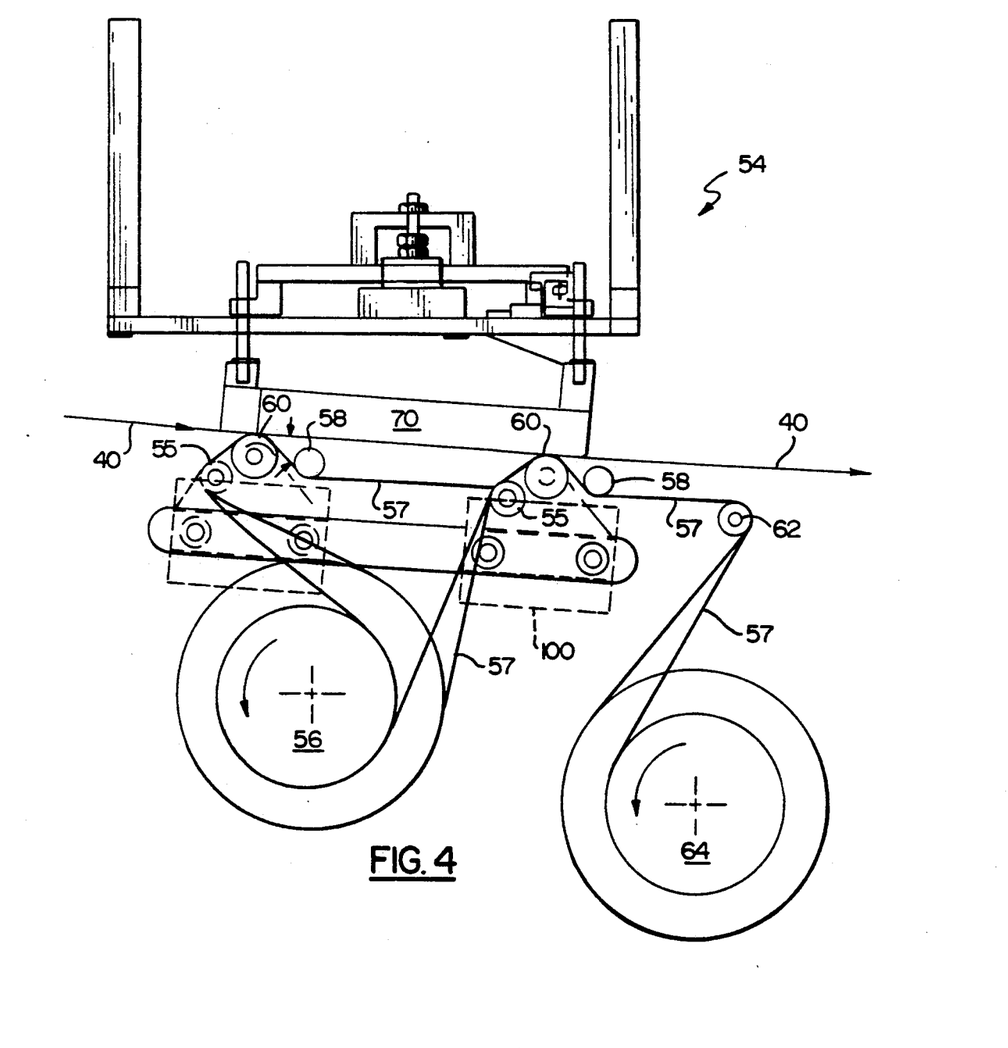
FIG. 4 is a side view of the polyolefin peeling assembly of the present invention.

Referring now to FIG. 4, the polyolefin peeler assembly 54 includes supply spool 56, which supplies a high tack tape 57 that is fed over a guide roller 55, a pressure roller 60, a separating roller 58, and another guide roller 62 and is respooled on a take up spool 64. The rollers 55, 60, 58 are part of a roller assembly 100. Pressure plate and chuck assembly 70 moves vertically downward to force the tape 57 in contact with the leading edge of the resist decal. The roller assembly 100 is moved linearly towards the trailing edge of the resist decal thereby causing the pressure roller 60 to roll the high tack tape 57 across the polyolefin layer of the resist decal. Once the polyolefin layer 20 has been removed, the pressure plate and chuck 70 is withdrawn vertically upward and the resist decal is ready to be laminated to the semiconductor wafer 72. It is preferable that pressure roller 60 provides approximately 50 grams of force to the bottom of the resist decal.

Figure 5A:
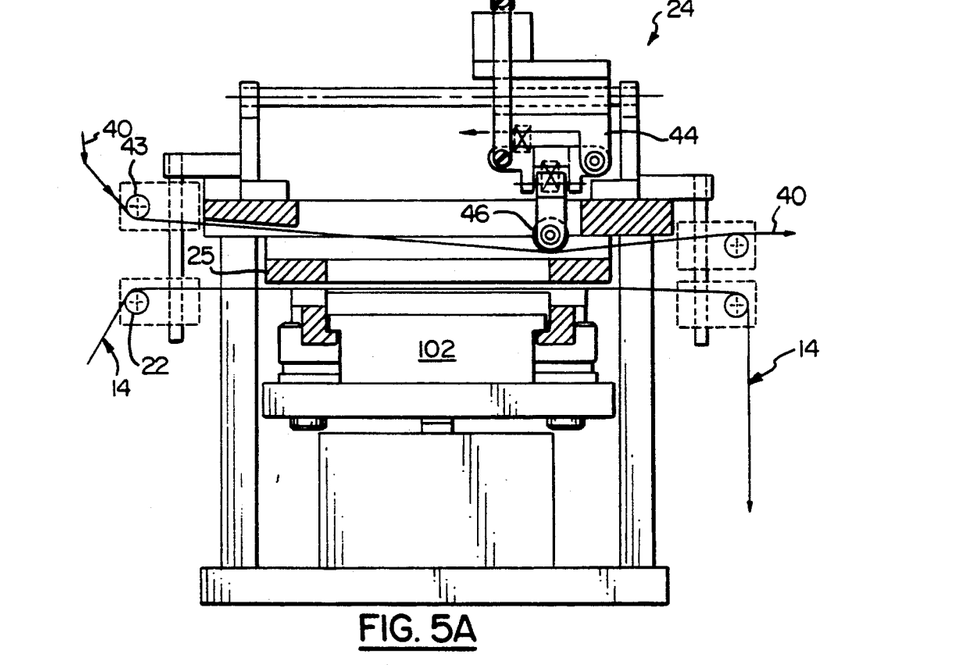
FIG. 5A is a cross-sectional view of the punch and die assembly of the present invention in the retracted position.

Referring now to FIG. 5A, the punch and die assembly 24 in the retracted position includes a circular punch 102, a circular die 25, a roller 46 and a roller transport assembly 44.

Figure 5B:
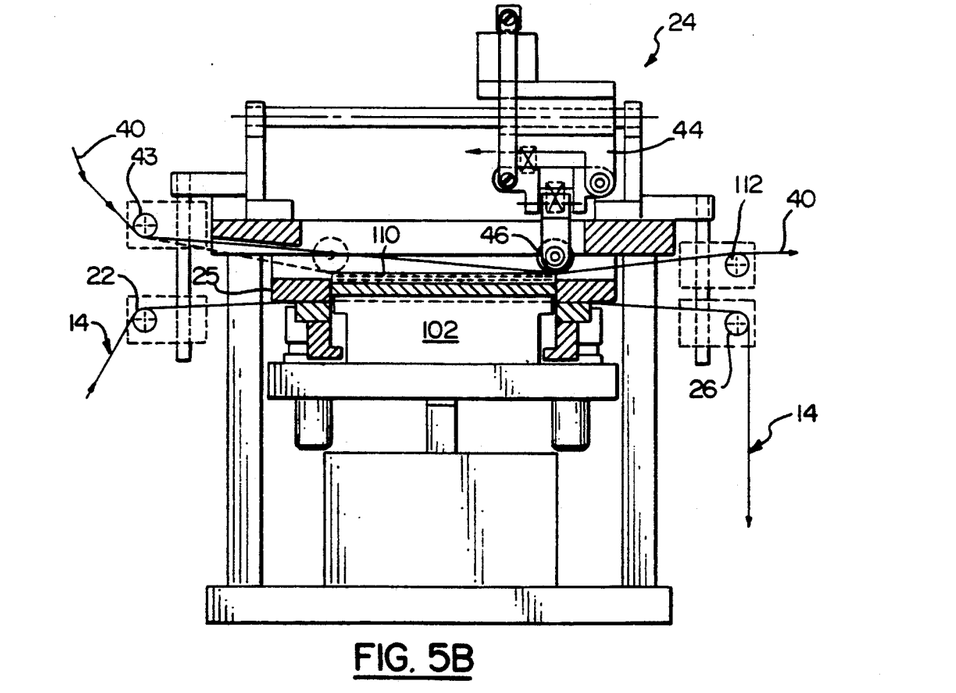
FIG. 5B is a cross-sectional view of the punch and die assembly of the present invention in the extended position.

Referring now to FIG. 5B, the punch 102 moves vertically upward, pushing the drive film resist material 14 through the circular die 25 thereby creating a circular dry film resist decal. The top surface 110 of the punch 102 is porous and provides a vacuum which clamps the dry film resist decal as it is being punched. Vacuum clamping is widely utilized in the semiconductor industry, particularly for holding semiconductor wafers and is well known in the prior art. The angle B is required to pull the polyolefin down and away from the resist decal.

Once the punch 102 is at its maximum vertical position, the roller 46 is driven linearly by a roller transport assembly 44 and roller 46 rolls the transport tape 40 across the face of the dry film resist decal. A rear roller 43 and a front roller 112 keep the transport tape 40 at a proper angle relative to the decal, which is now held on the vacuum 110 surface. The dry film resist decal is now bonded to the transport tape 40 and the punch 102 is moved vertically downward and the resist decal is ready to be transported to the polyolefin peeler assembly 54. It is preferable that the roller 46 apply a downward force of about 1 lb. and that the angle between the transport tape 40 and the dry film resist decal be approximately 10 degrees. It is also preferable that the speed of the roller transport assembly 44 be approximately 50 mm per second.

Although the invention has been shown and described with exemplary embodiments thereof it should be understood by those skilled in the art that the foregoing and various other changes, omissions and additions may be made therein and thereto without departing from the spirit and the scope of the invention.

I claim:

1. An automatic laminator, for laminating onto a series of semiconductor wafers a laminating material which is packaged in sheets between a protective bottom and top sheet, the automatic laminator comprising:
    punching means for punching the material into a first decal, said first decal having a bottom protective layer, a middle layer of the laminating material and a top protective layer;
    transferring means for transferring said first decal to a sticky transport medium by adhering the top layer to said sticky transport medium;
    first removing means for removing the bottom protective layer from said first decal;
    laminating means for laminating the middle layer of said first decal to the semiconductor wafer; and
    second removing means for removing said sticky transport medium.

2. The automatic laminator according to claim 1, wherein said transferring means comprises:
    first vacuum chuck means for holding said first decal; and first rolling means disposed above said sticky transport medium for rolling said sticky transport medium onto the top layer of said first decal.

3. The automatic laminator according to claim 1, wherein said first removing means comprises:
supporting means for supporting said transport medium;
sticky peeler tape having a tack sufficient to stick to the bottom protective layer of said first decal; and
second rolling means for rolling the bottom protective layer onto said sticky peeler tape thereby providing a laminating decal having a layer of laminating material and a top protective layer.

4. The automatic laminator according to claim 1, wherein said laminating means comprises:
first heated vacuum chuck means for holding the semiconductor wafer; and
third rolling means disposed above said sticky transport tape for rolling the laminating material of said laminating decal onto the semiconductor wafer.

5. The automatic laminator according to claim 1, wherein said second removing means comprises:
second heated vacuum chuck means for holding the semiconductor; and
peeling means for peeling said transport medium away from the semiconductor wafer having a separating roller to angle said transport medium approximately perpendicular to the semiconductor wafer and a pressure roller to pull said transport medium away from the semiconductor wafer.

6. An automatic laminator, for laminating onto a series of semiconductor wafers a laminating material which is packaged in sheets between a protective bottom and top sheet, the automatic laminator comprising:
punching means for punching the material into a first decal, said first decal having a bottom protective layer, a middle layer of the laminating material and a top protective layer;
transferring means for transferring said first decal to a sticky transport medium by adhering the top layer to said sticky transport medium;
first removing means for removing the bottom protective layer from said first decal;
laminating means for laminating the middle layer of said first decal to the semiconductor wafer; and
second removing means for removing said sticky transport medium and the top protective layer from the semiconductor wafer.

7. The automatic laminator according to claim 6, wherein said second removing means comprises:
second vacuum chuck means for holding the semiconductor wafer; and
peeling means for peeling said transport medium and said top protective layer of said first decal away from the semiconductor wafer having a separating roller to angle said transport medium approximately away from the semiconductor wafer and a pressure roller to pull said transport medium and said top protective layer away from the semiconductor wafer.

8. An automatic laminator, for laminating onto a series of semiconductor wafers a laminating material which is packaged in sheets between a protective bottom and top sheet, the automatic laminator comprising:
first drive means for incrementally advancing the laminating material;
punch and die means for punching the packaged material into consecutive first decals with each said incremental advance, each said first decal having a shape which conforms to the shape of the semiconductor wafer and being comprised of a bottom protective layer, a middle layer of the laminating material, and a top protective layer;
first take up means for collecting excess material which is excluded from said first decals;
first chuck means for clamping said first decals;
sticky transport tape disposed above said first decals having sufficient tack to stick to the top protective layer;
second drive means for incrementally advancing said transport tape in unison with said incremental advances of the laminating material;
first roller means disposed above said first chuck means and said sticky transport tape for rolling said transport tape uniformly onto said top protective layer of said first decals with sufficient force to stick said first decals to said transport tape;
first stripping means for stripping said bottom protective layer from said first decals having: a) supporting means for supporting said transport tape; b) sticky stripping tape having sufficient tack to stick to said bottom protective layer of said first decals; c) second roller means for creating laminating decals by removing said bottom protective layer by first, bonding said stripping tape to said bottom layer of said first decals and second, pulling said stripping tape away from said first decals with sufficient force to cause said stripping tape to strip said bottom protective layer of said first decals away from said laminating material;
laminating means for laminating said laminating decals to the semiconductor wafers having: a) first heated chuck means for clamping the semiconductor wafers below said laminating decals; b) third roller means disposed above said laminating decals for creating laminated semiconductor wafers by rolling said laminating decals onto the semiconductor wafers with sufficient force to laminate said laminating decals uniformly to the semiconductor wafers; and
second stripping means for stripping said transport tape and said top protective layer away from said laminated semiconductor wafers having: a) second chuck means for clamping said laminated semiconductor wafers; b) fourth roller means for pulling said transport tape and said top protective layer away from said laminated semiconductor wafers.

9. The automatic laminator according to claim 8, wherein:
said second chuck is heated; and
said second stripping means strips only said transport tape away from said laminated semiconductor wafers.

10. The automatic laminator according to claim 8, wherein said first heated chuck is heated to a temperature on the order of 85 degrees Celcius.

11. The automatic laminator according to claim 8, wherein said first roller means comprises:
a first gimbaled roller having a pliable rolling surface for rolling said transport tape into contact with said first decals; and
first roller drive means for driving said first gimbaled roller across said first decals.

12. The automatic laminator according to claim 8, wherein said second roller means comprises:

a first pressure roller for rolling said stripping tape into contact with said bottom protective layer with sufficient force to cause said stripping tape to stick to said bottom protective layer, said first pressure roller having a pliable rolling surface;

a first separating roller disposed behind said first pressure roller in the direction of rolling for pulling said stripping tape away form said transport tape; and second roller drive means for driving said first pressure, guide and separating rollers across the bottom surface of said first decals.

13. The automatic laminator according to claim 8, wherein said third rolling means comprises:

a second gimbaled roller having a pliable rolling surface; and third roller drive means for driving said third gimbaled roller across the semiconductor wafers.

14. The automatic laminator according to claim 8, wherein said fourth rolling means comprises:

a second separating roller for bending said transport tape away from said laminated semiconductor wafer; and a second pressure roller disposed behind said second guide roller in the direction of rolling for pulling said transport tape away from said laminated semiconductor wafer.

15. The automatic laminator according to claim 14, wherein said second pressure roller comprises a roller having a soft pliable rolling surface having a center and two ends, said rolling surface having a pattern thereon which provides a pulling pressure on said transport tape from said center to said ends.

16. The automatic laminator according to claim 8, wherein said roller means have silicon rubber rolling surfaces.

17. The automatic laminator according to claim 8, wherein said first advance mechanism comprises:

first moving gripper means for repetitively first gripping the laminating material at a start position, second pulling the laminating material a predetermined increment, third releasing the laminating material and fourth returning to said start position;

first stationary gripper means for gripping the laminating material during the time interval when said moving gripper means has released the laminating material.

18. The automatic laminator according to claim 8, wherein said second advance mechanism comprises:

second moving gripper means for repeating the sequence of gripping said transport tape at a start position, pulling said transport tape a predetermined increment, releasing said transport tape and returning to said start position;

second stationary gripper means for gripping said transport tape during the time interval when said moving gripper means has released said transport tape.

19. The automatic laminator according to claim 8, wherein said chuck means are comprised of vacuum chucks.

20. A dry film photoresist applicator, for laminating onto a series of semiconductor wafers a dry film photoresist which is packaged in sheets between a protective bottom and top sheet, the dry film photoresist applicator comprising:

first drive means for incrementally advancing the dry film photoresist;

punch and die means for punching the packaged material into consecutive first decals with each said incremental advance, each said first decal having a shape which conforms to the shape of the semiconductor wafer and being comprised of a bottom protective layer, a middle layer of dry film photoresist, and a top protective layer;

first take up means for collecting excess material which is excluded from said first decals;

first chuck means for clamping said first decals;

sticky transport tape disposed above said first decals having sufficient tack to adhere to the top protective layer;

second drive means for incrementally advancing said transport tape in unison with said incremental advances of the dry film photoresist;

first roller means for rolling said transport tape uniformly onto the top protective layer of said first decals with sufficient force to bond said first decals to said transport tape;

first stripping means having: a) support means for supporting said transport tape; b) sticky stripping tape having sufficient tack to adhere to the bottom protective layer of said first decals; c) second roller means for creating laminating decals by first, bonding said stripping tape to the bottom layer of said first decals and second, pulling said stripping tape away from said first decals with sufficient force to cause said stripping tape to strip the bottom protective layer of said first decals away from the dry film photoresist;

laminating means having: a) second chuck means for clamping the semiconductor wafers below said laminating decals; b) third roller means disposed above said laminating decals for creating laminated semiconductor wafers by rolling said laminating decals onto the semiconductor wafers with sufficient force to laminate said laminating decals uniformly to the semiconductor wafers; and second stripping means having: a) third chuck means for clamping said laminated semiconductor wafers; b) fourth roller means for pulling said transport tape away from said laminated semiconductor wafers to thereby strip said transport tape and the top protective layer of said first decals away from said laminated semiconductor wafers.

21. The dry film photoresist applicator according to claim 20, wherein said third chuck is heated for thereby heating said laminated substrates, and said fourth roller applies a sufficient force on said transport tape approximately perpendicular and away from said laminated semiconductor wafers to strip only said transport tape away from said laminated semiconductor wafers.

22. The dry film photoresist applicator according to claim 20, wherein said second chuck is heated for thereby heating the semiconductor wafers.

23. The dry film photoresist applicator according to claim 20, wherein said first roller means comprises:

a first gimbaled roller having a pliable rolling surface for rolling said transport tape into contact with said first decals; and first roller drive means for driving said first gimbaled roller across said first decals.

24. The dry film photoresist applicator according to claim 20, wherein said second roller means comprises:

a first pressure roller for rolling said stripping tape into contact with the bottom protective layer of said first decals with sufficient force to cause said stripping tape to stick to the bottom protective layer of said first decals, said first pressure roller having a pliable rolling surface;

a first separating roller disposed behind said first pressure roller in the direction of rolling for pulling said stripping tape away from said transport tape; and second roller drive means for driving said first pressure, guide and separating rollers across the bottom protective layer of said first decals.

25. The dry film photoresist applicator according to claim 20, wherein said third rolling means comprises:
a second gimbaled roller having a pliable rolling surface; and
third roller drive means for driving said second gimbaled roller across said semiconductor wafer.

26. The dry film photoresist applicator according to claim 20, wherein said fourth rolling means comprises:
a second separating roller for bending said transport tape away from said laminated semiconductor wafer;
a second pressure roller disposed behind said second guide roller in the direction of rolling for pulling said transport tape away from said laminated semiconductor wafer.

27. The dry film photoresist applicator according to claim 26, wherein said second pressure roller comprises a roller having a soft pliable rolling surface having a center and two ends, said rolling surface having a pattern thereon which provides a pulling pressure on said transport tape from said center to said ends.

28. The dry film photoresist applicator according to claim 20, wherein said roller means have silicon rubber rolling surfaces.

29. The dry film photoresist applicator according to claim 20, wherein said first advance mechanism comprises:
first moving gripper means for repetitively first gripping the dry film photoresist at a start position, second pulling the dry film photoresist a predetermined increment, third releasing the dry film photoresist and fourth returning to said start position;
first stationary gripper means for gripping the dry film photoresist during the time interval when said moving gripper means has released the dry film photoresist.

30. The dry film photoresist applicator according to claim 20, wherein said second advance mechanism comprises:
second moving gripper means for repeating the sequence of gripping said transport tape at a start position, pulling said transport tape a predetermined increment, releasing said transport tape and returning to said start position;
second stationary gripper means for gripping said transport tape during the time interval when said moving gripper means has released said transport tape.

31. The dry film photoresist applicator according to claim 20, wherein said chuck means are comprised of vacuum chucks.

32. A dry film photoresist applicator, for laminating onto a series of semiconductor wafers a dry film photoresist which is packaged in sheets between a protective bottom and top sheet, the dry film photoresist applicator comprising:
first drive means for incrementally advancing the dry film photoresist having: a) first moving gripper means for repetitively gripping the dry film photoresist at a start position, pulling the dry film photoresist a predetermined increment, releasing the dry film photoresist and returning to said start position;
b) first stationary gripper means for gripping the dry film photoresist during the time interval when said moving gripper means has released the dry film photoresist;
punch and die means for punching the packaged material into consecutive first decals with each said incremental advance, each said first decal having a shape which conforms to the shape of the semiconductor wafer and being comprised of a bottom protective layer, a middle layer of dry film photoresist, and a top protective layer;
first take up means for collecting excess material which is excluded from said first decals;
first vacuum chuck means for vacuum clamping said first decals;
sticky transport tape disposed above said first decals having sufficient tack to stick to the top protective layer;
second drive means for incrementally advancing said transport tape in unison with said incremental advances of the dry film photoresist having: a) first moving gripper means for repetitively gripping the dry film photoresist at a start position, pulling the dry film photoresist a predetermined increment, releasing the dry film photoresist and returning to said start position; b) first stationary gripper means for gripping the dry film photoresist during the time interval when said moving gripper means has released the dry film photoresist;
first roller means for rolling said transport tape uniformly onto the top protective layer of said first decals with sufficient force to bond said first decals to said transport tape, said first roller means having: a) a first gimbaled roller having a pliable rolling surface; b) first roller drive means for driving said first gimbaled roller across the top surface of said first decals;
first stripping means for stripping the bottom protective layer away from said first decals, having: a) support means for supporting said transport tape; b) sticky stripping tape having sufficient tack to stick to the bottom protective layer of said first decals; c) second roller means for creating laminating decals by bonding said stripping tape to the bottom layer of said first decals and pulling said stripping tape away from said first decals with sufficient force to cause said stripping tape to strip the bottom protective layer of said first decals away from the dry film photoresist, said second roller means having: 1) a first pressure roller for rolling said stripping tape into contact with the bottom protective layer of said first decals with sufficient force to cause said stripping tape to stick to the bottom protective layer of said decals, said first pressure roller having a pliable rolling surface; 2) a first separating roller disposed behind said first pressure roller in the direction of rolling for pulling said stripping tape away from said transport tape; 3) second roller drive means for driving said first pressure and separating roller across the bottom protective layer of said first decals;
laminating means having: a) second heated vacuum chuck means disposed below said laminating decals for clamping and heating the semiconductor wafers; b) third roller means disposed above said laminating decals for creating laminated semiconductor wafers by rolling said laminating decals onto the semiconductor wafers with sufficient force to laminate said laminating decals uniformly to the semiconductor wafers, said third roller means having: a) a second gimbaled roller having a pliable rolling surface; b) third roller drive means for driving said third gimbaled roller across said semiconductor wafer; and second stripping means having: a) third heated vacuum chuck means for clamping and heating said laminated semiconductor wafers; b) fourth roller means for pulling said transport tape about perpendicularly away from said laminated semiconductor wafers to thereby strip said transport tape away from the top protective layer of said first decals, said fourth roller means having: 1) a second separating roller for bending said transport tape away from said laminated semiconductor wafers; 2) a second pressure roller disposed behind said second separating roller in the direction of rolling for pulling said transport tape away from said laminated semiconductor wafer.

* * * * *